United States Patent [19]

Chase et al.

[11] Patent Number: 4,821,945
[45] Date of Patent: Apr. 18, 1989

[54] SINGLE LEAD AUTOMATIC CLAMPING AND BONDING SYSTEM

[75] Inventors: Judith A. Chase, Franklin; Douglas W. Phelps, Jr., Burlington; Robert J. Redmond; Stephen G. Starr, both of Essex Junction, all of Vt.

[73] Assignee: International Business Machines, Armonk, N.Y.

[21] Appl. No.: 68,679

[22] Filed: Jul. 1, 1987

[51] Int. Cl.⁴ .................. B23K 31/02; B23K 5/22; B23K 37/00
[52] U.S. Cl. .................... 228/179; 228/213; 228/4.5; 228/44.7
[58] Field of Search .............. 228/179, 212, 213, 4.5, 228/44.7, 904

[56] References Cited

U.S. PATENT DOCUMENTS

| | | | |
|---|---|---|---|
| 3,596,044 | 7/1971 | Katzin | 228/4.5 X |
| 3,672,556 | 6/1972 | Diepeveen | 228/47 |
| 3,806,019 | 4/1974 | Diepeveen | 228/3 |
| 3,863,827 | 2/1975 | Foulke et al. | 228/5 |
| 3,894,671 | 7/1975 | Kulicke et al. | 228/4.5 |
| 4,053,096 | 10/1977 | Heim | 228/4.5 |
| 4,142,714 | 3/1979 | Diepeveen | 269/8 |
| 4,202,482 | 5/1980 | Sade et al. | 228/4.5 |
| 4,213,556 | 7/1980 | Persson et al. | 228/104 |
| 4,437,604 | 3/1984 | Razon et al. | 228/179 |
| 4,475,681 | 10/1984 | Ingle | 228/4.5 |
| 4,485,957 | 12/1984 | Sugimoto et al. | 228/4.5 |
| 4,527,730 | 7/1985 | Shirai et al. | 228/179 |

OTHER PUBLICATIONS

Research Disclosure, #26622, Kenneth Mason Publ. Ltd., Jun. 1986, No. 266.

Primary Examiner—Nicholas P. Godici
Assistant Examiner—Carmine Cuda
Attorney, Agent, or Firm—Sughrue, Mion, Zinn, Macpeak, and Seas

[57] ABSTRACT

A system of single lead clamping and bonding in the assembly of integrated circuit devices. A capillary bonder has a clamp member rotatably mounted around the capillary for movement with the bond head. The clamp is moveable vertically to contact and clamp a terminal to be bonded. The clamp is rotatable to orient itself with respect to the terminal and the fine wire. The capillary and clamp move under computer control to make a series of bonds, typically between lead frame fingers and terminals on a semiconductor device.

15 Claims, 1 Drawing Sheet

SINGLE LEAD AUTOMATIC CLAMPING AND BONDING SYSTEM

BACKGROUND OF THE INVENTION

1. FIELD OF THE INVENTION

This invention relates to the assembly of integrated circuit devices and, in particular, to a technique of automatic wire bonding utilizing single lead clamping at individual bond sites.

2. PRIOR ART

In the construction of integrated circuit devices, that is, chips, dies, etc., typically a semiconductor chip is mounted on a base and wiring connections are established from a lead frame placed around the chip to various terminal pads located on the chip. The techniques of actually accomplishing the electrical connections vary from fully automatic to hybrids requiring actual operator manual steps. Given the extremely fine wire size and the close dimensions involved, this step is time consuming and a source of defects in product as a result of incomplete or poor bonds being established.

Another source of the difficulty in achieving a high degree of repeatability at this step in semiconductor manufacture is that generally the chip is provided with an alpha barrier having a double sided adhesive film. That is, the alpha barrier is placed over a major surface of the semiconductor device and held in place with the adhesive film on one side. Then, during assembly, a lead frame strip with multiple device sites is overlaid on the alpha barrier material and held in place by the adhesive film on the top of the alpha barrier layer. At this intermediate stage of manufacture, the integrated circuit device (such as a chip, die) has the alpha barrier on a major surface and fixed onto the alpha surface is the lead frame having a series of metallic leads stabilized by means of the adhesive film on the alpha barrier. Should there be any misalignment, the leads on the lead frame may have longer or shorter effective lengths with the attendant differences in bending when the bonding tool is placed in contact.

The next step in fabrication is the bonding of selected terminal pads on the semiconductor device followed by bonding of selected leads from the lead frame to the device so that conductive wires may be fixed between the terminal ends of the lead frame conductors. Within the prior art there are a number of systems used to bond the pads on the device and the conductive wires to the lead frame fingers. However, the bonding is done in an unstabilized mode such that the wires may not be sufficiently held in place during the bonding step, or, in an extreme situation, the bond may take place between incorrect terminals.

Within the prior art a number of devices have been proposed for clamping metallic leads over a resilient film or tape at bonding sites. The clamping can be used for a variety of techniques. For example, U.S. Pat. No. 4,437,604 discloses the use of a wire clamp which is utilized to break the wire when the bonding tool is moved from the second bond location to begin metallic bonding at a new site. The technique however, does not clamp to stabilize the lead to be bonded at a single bond site. That is, the bonding tool is moved to a first location where an ultrafine wire is bonded to a terminal on the semiconductor device utilizing a combination of ultrasonic energy and pressure applied by the bonding tool. Then, either the bonding tool holder or the workpiece holder upon which the semiconductor device is mounted is moved to cause the wire to be fed out from the capillary bonding tool to form a length of wire which will be a fine wire interconnection between the terminal pad on the semiconductor device and the conductive terminal (lead frame finger) on the lead frame.

The bonding tool is then located over an appropriate terminal on the lead frame and a second bond is made again, by the application of force and ultrasonic energy applied by the bonding tool. Then, the wire is clamped and the table is moved to break the wire and form a wire bonding tail in the ultrasonic bonding tool. There is no stabilization of the lead frame at the location where the second bond is to take place. Another scheme used as a wire tail puller after the second bond is disclosed in U.S. Pat. No. 3,806,019. In the scheme of this patent, a wire clamp is operable to grip the wire and pull it away after the wire has been cut by a bonding torch. Reference is made to U.S. Pat. No. 3,894,671 which discloses a different technique of press clamping a lead frame strip to a heater block during bonding. Similarly, U.S. Pat. No. 4,527,730 discloses a wire loop shaping guide and clamp which is used to hold the wire independent of the bonding tool. The clamp, however, does not stabilize the conductive terminals on a lead frame to be bonded at a single bond site. Other techniques for wire clamping or combinations of clamp and feed devices for use in wire bonding tools are disclosed in U.S. Pat. Nos. 4,142,714; 3,672,556; 3,863,827; 4,475,681; and 4,202,482. The systems proposed in these patents are wire feeds used in conjunction with techniques for clamping the wire during feeding. Clamping is not effectuated for purposes of stabilizing the lead frame finger during wire bonding at a single site. Another class of prior art which utilizes clamping techniques is in detector schemes to determine whether a wire is present within the clamp. Such fault detectors are disclosed in U.S. Pat. Nos. 4,213,556 and 4,485,957.

Finally, within the prior art, techniques exists utilizing modular clamping fingers to clamp groups of metallized leads over a resilient film or tape at the bonding site. Such hold down techniques used in conjunction with ultrasonic or thermosonic wire bonding techniques are disclosed in "Research Disclosure", June 1986, No. 266, as disclosure 26622.

A hallmark deficiency of all prior art systems described herein is their inability to provide an affirmative clamp mechanism which stabilizes lead terminals on a lead frame to be bonded at single bond sites. Consequently, within the prior art, complicated workholder designs are required to fix the lead frame in position to allow an automatic wire bonding tool to step across the semiconductor device and make appropriate wiring connections.

SUMMARY OF THE INVENTION

Given the deficiencies of the prior art it is an object of this invention to provide a clamp mechanism usable in conjunction with a wire bonder that stabilizes unsecured individual metallized leads.

Another object of this invention is to define a system which enables the energy transfer required to form repeatable high-strength wire bonds to be made in a programmable system with the requisite degree of accuracy.

Yet another object of this invention is to provide a stabilized wire bonding system which provides, at an individual bond site, the necessary clamp force, velocity, clamp to capillary distance, lead finger location control and wire release orientation controlled by the bonder.

A further object of this invention is to define a wire bonding system which allows for programmable clamp site parameters utilizing high-speed automatic wire bonding over either resilient films or tapes.

These and other objects of this invention are accomplished by utilizing an integral clamping foot and bonding tool which is indexed to clamp an individual lead frame finger to enable the necessary transfer energy from the bonding tool to form repeatable high-strength wire bonds. This clamping technique is applicable to both unsecured lead frame fingers as well as those which are placed over a resilient film or tape. The clamp is movable vertically over a lead frame finger and rotatable about the bonding tool to align itself with the unsecured metallized lead of a lead frame. When placed on the lead frame, the terminal is then stabilized, that is pressed against the underlying material to ensure that when the bonding operation takes place sufficient transfer energy will be available.

In operation, generally the steps are assembly and affixation of the lead frame over the semiconductor device and, if utilized, placement of an intervening alpha barrier. Other techniques of mounting, such as back bonded chip on card, board or ceramic substrates and the like are precursor steps. The following clamping and bonding processes take place in accordance with this invention.

First, the assembly to be bonded is indexed into an automatic bond station workholder and a universal clamp. The assembly, typically, comprises the metallization lead frame, the resilient film or tape (where necessary) and the chip which is generally mounted onto a lead frame or a substrate. The first bond is typically to the chip input/output pads and is completed by the bonder without employing the single lead clamping leg. That is, because the chip terminal pads are stabilized, there is no requirement to apply clamping pressure to ensure the necessary energy transfer.

Next, the workholder or bonding tool, or both, are indexed to a second or a termination bond site. In accordance with known computerized techniques, direction of travel is sensed. The single lead clamping leg or legs are then oriented to provide wire release after the second bond takes place.

To reduce the index time, a clamping leg may be placed in each quadrant of the work station. Further increases in speed may be accomplished by using a matrix of clamping legs. This results in high-speed automatic bonding which can take place at reproducible rates far in excess of utilizing a single indexed clamping leg and bonding tool. Also, programmable corrections can be made in this orientation at individual bond sites to accommodate special metallization placement designs.

A single lead clamping leg then descends to an individual bond site at each site's programmable velocity, clamp to capillary distance, lead finger location, orientation, and contact force. The single metallized unsecured lead or lead over a resilient film or tape is then wire bonded by use of the bonding tool which descends through an opening in the clamping tool to establish electrical continuity between the first and second bond sites. By having computer control over the system, individual bond sites may be programmable utilizing the single lead clamp leg to establish the necessary process parameters. This again accommodates special metallization placement and orientation designs by insuring that the necessary stabilization for a reliable bond occurs.

Following the descent to the single lead clamped site through the leg slot and bonding, the tool lifts followed by the single lead clamping leg.

The sequence then repeats itself by having the workholder or wire bonder head moved to a new site to begin the two bond operations necessary between a pad on a semiconductor device and a terminal of the lead frame.

This invention will be described in greater detail by referring to the attached drawings and a description of the preferred embodiment which follows.

DESCRIPTION OF THE PREFERRED EMBODIMENT

Figure 1:
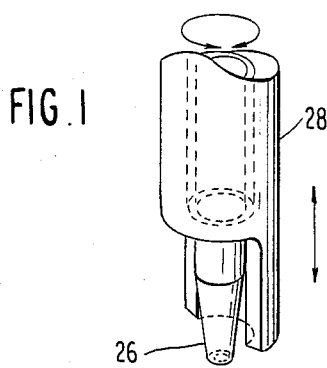
FIG. 1 is a schematic perspective view showing the essential elements of the clamping leg and wire bonding capillary.
Figure 2:
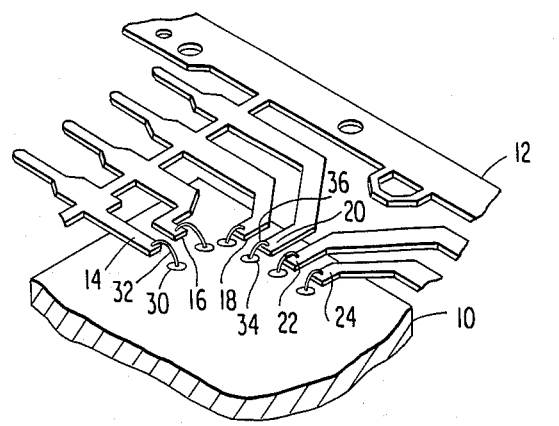
FIG. 2 is a schematic view of a lead frame disposed over a semiconductor device having leads at different angles.

Referring now to FIGS. 1, 2 and 3, the essential elements of this invention are depicted. A semiconductor device 10 is mounted to a lead frame, as illustrated. An alpha barrier utilizing well known technology is generally placed over the semiconductor device 10, not illustrated. The alpha barrier may employ an adhesive on both sides to bond one side to the top of the device 10 and having the adhesive on the opposite side used to affix a lead frame to the alpha barrier. In accordance with known assembly techniques, the lead frame is positioned over the device 10. The lead frame 12 comprises an array of terminals 14–24. It will be appreciated that in the semiconductor packaging field the term "lead frame" has a specific meaning as evidenced by the prior art discussed herein. The drawing depicts only a small portion of the lead frame as illustrated in FIG. 2.

In accordance with this invention, a tailless thermosonic or ultrasonic capillary 26 is mounted inside a clamping foot 28. The thermosonic capillary may be a conventional bonding tool such as a Micro-Swiss model 472A or 1413A capillary. It will be understood by those working in this art that the choice of the particular capillary used is a function of the particular range and application.

The clamping foot 28 comprises a hollow member having a cut-away portion 27. The bottom surface of the foot may have an insulative layer such as nylon or a ceramic to prevent heat loss through the clamp during bonding. As illustrated, the cut-away portion allows for wire access to the bond site, however, the foot sufficiently partially encompasses the bond side to ensure stabilization. While illustrated as an integral assembly of capillary 26 and clamping foot 28, these devices may be separated.

The bonder capillary 26 and the clamping foot 28 move irrespective of whether they are separate or combined as a unit from one bonding site to another. Movement is under computer control utilizing indexing techniques which are well known in the technology.

Reference is made to Hueners et al, "Advances in Automated Wire and Die Bonding", *Solid State Technology*, March 1983, pp. 69–76; Markstein, "Wire Bonding Surges Toward Market Growth and New Technology", *Electronic Packaging & Production*, February 1984, pp. 89–92; and U.S. Pat. No. 4,551,912 which disclose automated wire bonding schemes. The Hueners et al article specifically details the computer/bonder interface and system architecture. Further, product specification by Kulicke and Soffa Industries, Inc. for the Models 1419, 1419/DAWN ™ and 1482 automatic wire bonding systems provide details as to commercially available systems. It will be appreciated that this invention uses those known techniques for purposes of controlling movements of the bonder capillary 26 and the clamping foot 28. The techniques of programming such known systems is within the scope of their normal operation.

Figure 3A:
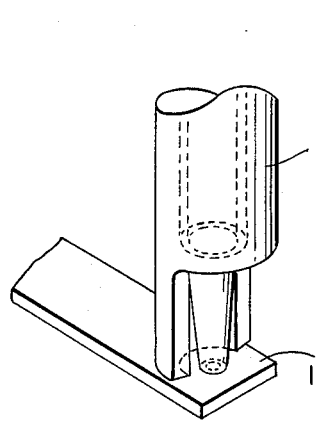
FIGS. 3A and 3B are schematic illustrations demonstrating positioning of the clamping leg to provide necessary stabilization for two leads positioned 90° to each other.

That is, the computer has stored therein a series of instructions as to locations in which connections between various pads on the device 10 and various terminals on the lead frame 12 are to be made. Then, the computer, in an indexed manner, moves the bonding tool and clamping foot to the locations in a predetermined sequence. Additionally, the computer monitors the downward velocity of the clamping foot 28 and its orientation vis-a-vis a particular lead frame terminal. Thus, as illustrated in FIG. 3A, in order to apply the necessary clamping force to a terminal 14, the computer would direct the clamping foot 28 to rotate (as illustrated by the circular arrows in FIG. 1) to a position which placed it on the lead frame 14 in a manner illustrated in FIG. 3A. This rotational movement of the pressure foot would occur at a point in time when the bonder and clamp mechanism is moved from one site to another. The computer is programmed to move the bonder and clamp from one site to another. The computer also controls movement downward to the bonding site as well as the downward velocity of the clamping foot and capillary as illustrated by the arrows in FIG. 1. The computer further controls the capillary to clamp distances thereby ensuring that the necessary stabilization occurs to achieve a reliable bond.

Figure 3B:
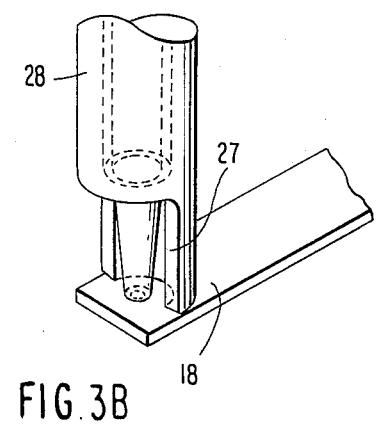

Then, as the unit moves to the next position, for example, a bond at lead frame terminal 18, the clamping foot would be rotated into a position illustrated in FIG. 3B perpendicular to that orientation used in the bonding operation for lead frame terminal 14. In this manner, the clamping foot is rotatable about the bonding tool to align itself laterally at the end of a lead frame terminal to apply the necessary pressure for the bonding operation.

In accordance with this invention, the assembly to be bonded is indexed into an automatic bond station workholder having a universal clamp, not shown. The clamp compresses the assembly which is typically a lead frame or substrate, a chip mounted to the lead frame or substrate, a resilient film or tape comprising the alpha barrier on the chip and the lead frame. Alternative assemblies can comprise a card, a resilient film and the lead frame, or a ceramic substrate, film, chip and lead frame assembly. Also, chip on board assemblies having a fine metallization over resilient fuilms can be used in accordance with this invention. Once the subassembly to be bonded is fixed at the work station, a first bond takes place. Typically, this is a bond made by the bonding tool 26 at the terminal pads 30 on the device 10. That is, a wire lead is bonded from the bonding tool 26 to the chip input/output pad 30 and it can be completed with the single lead clamping tool 28 in the retracted position. The clamp is not required because the device 10, given its mass and location is stabilized by itself on the workholder.

Then, the workholder or a combination of the capillary 26 and the clamping foot 28, or both are indexed to a second bond site. This is done under computer control with the direction and orientation of the clamping foot changed, as necessary, to provide wire release after the second bond. Thus, for example, if a first bond is made at terminal 30 with the second bond to be made at the lead frame terminal 14, the clamp would rotate to a position illustrated in FIG. 3A relative to terminal 14. The single lead clamping leg 28 then descends to the individual second bond site, in this case on terminal 14 at a programmable velocity and contacts the single metallized unsecured lead or lead over a resilient film or tape. The clamping foot force and location can accommodate special metallization placement and orientation designs. That is, while illustrated as positioned at the end of the terminal 14, it is apparent that the clamp can be placed anywhere along the length of that terminal. Thus, as illustrated in FIG. 2, if the terminals have a zig-zag or angled orientation given the particular metallization requirements, this system allows the placement of the clamp at any desired location. Once the clamp is in place providing the necessary pressure on the terminal 14, the bonding tool descends adjacent to the single lead clamping leg slot, that is within the clamp and complets the second bond. This is shown in FIG. 2 as the wire connection 32 between the pad 30 and the terminal 14.

Then, the capillary lifts followed by the clamping foot. As the capillary retracts upward, the wire is clamped above the capillary and automatically severed, completing the bond as illustrated in FIG. 2.

It is appreciated that a stitch bonding operation may also be performed by not severing the wire and have the operation proceed to the next bonding site with the wire still attached until the stitch is completed.

If the next operation is, for example, a clamping operation at pad 34, then the clamping leg would be rotated during movement of bonding tool and clamping leg to a position shown in FIG. 3B. A wire bond is made to the terminal 34 without utilizing the clamping leg. The tool is then indexed to descend to the lead frame terminal 18 as illustrated in FIG. 3B and a second bond is made to provide the conductive connection 36. These steps are then repeated so long as bonding operations are to take place. It will be appreciated that the programmed steps, such as capillary to clamp distance, lead finger location, and the like may be selectively practiced depending on the manufacturing operation.

Although not illustrated in FIGS. 1 and 2, it is apparent that multiple clamping/bonding assemblies can be utilized. For example, such units can be mounted at quadrants of the capillary, each operating independently to allow for increased efficiency. The use of multiple clamps materially reduces clamp rotation time.

In accordance with this invention then, the clamp leg 28 stabilizes unsecured individualized metal lead such as the cantilevered terminal of a lead frame. By stabilizing the lead, the necessary energy transfer from the capillary bonder to the lead frame is facilitated such that repeatable high-strength wire bonds can be achieved. Using computer control techniques and, existing software known in the technology to position the bonder per se, individual bond site clamp force, downward velocity and tailored locations can be achieved such that the clamp leg assures a wire release orientation after the second bond has been made. Moreover, given this versatility in positioning, this invention accommodates different lead sizes, thicknesses and location variations in the lead frame terminals. In addition to providing a technique of wire bonding from device 10 to a lead frame, this invention also allows for high-speed automatic wire bonding over resilient films or tape.

An important aspect of this invention is the use of multiple bond capillaries with clamps positioned at various locations at the work station or stations to reduce the index time from one bond site to another. Consequently, throughput in the fabrication of semiconductor devices, a standing area of improvement, is materially facilitated by this invention.

It is apparent that modifications of this invention may be made without departing from the essential scope of this invention.

We claim:

1. Apparatus for bonding a fine wire lead to a terminal comprising an assembly of;
   a bonder having a capillary for dispensing a fine wire and bonding it to a terminal, and
   a selectively rotated clamp mounted around said capillary bonder, said clamp having leg portion means for clamping said terminal, said clamp movable vertically with respect to said capillary and selectively rotatable around said capillary bonder to position said leg portion means on said terminal.

2. The apparatus of claim 1, further comprising means to move said capillary and said clamp from a first bonding location to a second bonding location.

3. The apparatus of claim 1, wherein said bonder comprises an ultrasonic bonder.

4. The apparatus of claim 1, wherein said bonder comprises a thermosonic bonder.

5. The apparatus of claim 1, wherein said bonder comprises a thermal compression bonder.

6. The apparatus of claim 1, further comprising a plurality of capillary bonder and clamp assemblies, said assemblies positioned at one or more work stations at spaced locations to simultaneously bond fine wire leads to terminals at spaced locations.

7. A method of bonding a fine wire to a terminal comprising the steps of:
   positioning a single lead clamp over a region where a wire bond is to be made,
   lowering said single lead clamp to clamp a terminal,
   lowering a capillary of wire bonder adjacent to said single lead clamp and completing said wire bond to said terminal,
   raising said capillary and then said single lead clamp.

8. The method of claim 7, comprising the step of orienting, by rotating, said single lead clamp prior to lowering it onto said terminal.

9. The method of claim 7, wherein said step of lowering said single lead clamp comprises the step of lowering said single lead clamp at a programmable, monitored velocity.

10. The method of claim 7, further comprising the steps of moving said single lead clamp and capillary to a second bonding site, lowering said capillary and completing a second bond.

11. The method of claim 7, further comprising the steps of, moving said single lead clamp and capillary to a second bonding site, lowering said single lead clamp to engage another terminal and lowering said capillary adjacent to said single clamping lead and completing a second bond.

12. The method of claim 10, wherein the step of moving said single lead clamp and capillary comprises the steps of storing locations where bonds are to be made with respect to a group of terminals, and directing sequential movement of said single lead clamp and capillary to bonding sites in accordance with said stored locations.

13. The method of claim 11, further comprising the steps of moving said single lead clamp and capillary to a third bonding site, completing a bond at said third bonding site wherein said first, second and third bonds comprise a stitch bond.

14. The method of claim 7, further comprising the steps of programming and monitoring the clamping force of said single lead clamp on a terminal.

15. The method of claim 7, further comprising the steps of programming and monitoring the distance between the capillary and the terminal to be bonded.

* * * * *